(12) United States Patent
Ishizaka et al.

(10) Patent No.: US 8,058,728 B2
(45) Date of Patent: Nov. 15, 2011

(54) DIFFUSION BARRIER AND ADHESION LAYER FOR AN INTERCONNECT STRUCTURE

(75) Inventors: Tadahiro Ishizaka, Watervliet, NY (US); Shigeru Mizuno, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 12/242,416

(22) Filed: Sep. 30, 2008

(65) Prior Publication Data

US 2010/0078818 A1   Apr. 1, 2010

(51) Int. Cl.
*H01L 23/48* (2006.01)

(52) U.S. Cl. .................. 257/751; 257/E23.01; 257/753; 257/754; 257/758

(58) Field of Classification Search .................. None
See application file for complete search history.

(56) References Cited

U.S. PATENT DOCUMENTS

| | | | |
|---|---|---|---|
| 6,444,263 B1 | 9/2002 | Paranjpe | |
| 6,833,625 B1 | 12/2004 | Wang | |
| 2003/0203617 A1 | 10/2003 | Lane | |
| 2005/0181598 A1 | 8/2005 | Kailasam | |
| 2006/0113675 A1 | 6/2006 | Chang | |
| 2006/0240187 A1* | 10/2006 | Weidman | 427/248.1 |
| 2006/0249849 A1* | 11/2006 | Cohen | 257/758 |
| 2008/0254232 A1* | 10/2008 | Gordon et al. | 427/585 |

OTHER PUBLICATIONS

M.E. Gross et al, Journal of Vacuum Science and Technology B, American Vacuum Society, pp. 1548-1552, vol. 6, 1988.

T. Maruyama et al., Cobalt Thin Films Prepared by Chemical Vapor Deposition from Cobaltous Acetate, Applied Physics Letters, American Institute of Physics, Melville, NY, Sep. 16, 1991, pp. 1433-1434, vol. 59.

G.J.M. Dormans, OMCVD of Transition Metal and Their Silicides using Metallocenes and (Di)silane or Silicon Tetra-bromide, Journal of Crystal Growth, Elsevier Science Publishers B.V. (North Holland), pp. 806-816, vol. 108, 1991.

A.R. Ivanova et al., The Effects of Processing Parameters in the Chemical Vapor Deposition of Cobalt from Cobalt Tricarbonyl Nitrosyl, Journal of the Electrochemical Society, The Electrochemical Society, pp. 2139-2145, vol. 146, No. 6, 1999.

B.S. Lim et al., Atomic Layer Deposition of Transition Metals, Nature Materials, Nature Publishing Group, pp. 749-754, vol. 2, 2003.

S.B. Kang et al., CVD-Cobalt for the Next Generation of Source/Drain Salicidation and Contact Silicidation in Novel MOS Device Structures with Complex Shape, IEEE International Electron Devices Meeting (IEDM), Washington DC, Dec. 8-10, 2003, 4 pgs.

H. Bhandari et al., Vapor Deposition of Barrier/Adhesion/Seed Layers for Copper Interconnects, Materials Research Society, Spring Meeting, Mar. 25-27, 2008. Abstract only.

H.S. Rhee et al., Cobalt Metallorganic Chemical Vapor Deposition and Formation of Epitaxial CoSi2 Layer on Si(100) Substrate, Journal of the Electrochemical Society, The Electrochemical Society, Inc., pp. 2720-2724, vol. 146, No. 7, 1999.

(Continued)

*Primary Examiner* — Leonardo Andujar

(57) ABSTRACT

An interconnect structure is provided. The interconnect structure includes an interconnect opening formed within a dielectric material, a diffusion barrier on the dielectric material, where the diffusion barrier contains a compound from a thermal reaction between cobalt (Co) metal from at least a portion of a cobalt metal layer formed on the dielectric material and a dielectric reactant element from the dielectric material. The interconnect structure further includes a cobalt nitride adhesion layer in the interconnect opening, and a Cu metal fill in the interconnect opening, wherein the diffusion barrier and the cobalt nitride adhesion layer surround the Cu metal fill within the interconnect opening.

13 Claims, 13 Drawing Sheets

OTHER PUBLICATIONS

A.R. Londergan et al., Interlayer Mediated Epitaxy of Cobalt Silicide on Silicon(100) from Low Temperature Chemical Vapor Deposition of Cobalt, Journal of the Electrochemical Society, The Electrochemical Society, Inc., pp. C21-C27, vol. 148, No. 1, 2001.

K. Kim, Characteristics of Cobalt Thin Films Deposited by Remote Plasma ALD Method with Dicobalt Octacarbonyl, Journal of the Electrochemical Society, The Electrochemical Society, Inc., pp. H177-H181, vol. 154, No. 3, 2007.

J. Lee et al., Highly Conformal Deposition of Pure Co Films by MOCVD Using $Co_2(CO)8$ as a Precursor, Journal of the Electrochemical Society, The Electrochemical Society, Inc., pp. G539-G542, vol. 153, No. 6, 2006.

K. Lee et al, Characteristics of Ti-Capped Co Films Deposited by a Remote Plasma ALD Method Using Cyclopentadienylcobalt Dicarbonyl, Journal of the Electrochemical Society, The Electrochemical Society, Inc., pp. H899-H903, vol. 154, No. 10, 2007.

G.J.M. Dormans et al., OMCVD of Cobalt and Cobalt Silicide, Journal of Crystal Growth, Elsevier Science Publishers B.V. (North Holland), pp. 364-372, vol. 114, 1991.

F. Maury et al., Epitaxial Growth of CoGa on GaAs by Organometallic Chemical Vapor Deposition, Chemistry of Materials, American Chemical Society, pp. 84-89, vol. 5, 1993.

Z. Li et al., Nucleation and Adhesion of ALD Copper on Cobalt Adhesion Layers and Tungsten Diffusion Barriers, Electrochemical and Solid-State Letters, The Electrochemical Society, Inc., pp. G182-G185, vol. 8, No. 7, 2005.

J. Koike et al., Cu Alloy Metallization for Self-forming Barrier Process, Interconnect Technology Conference, Jun. 2006, p. 161-163.

Iijima et al., Growth Behaviour of Self-Formed Barrier Using Cu-Mn Alloys at 350 to 600C, Interconnect Technology Conference, Jun. 2006, p. 155-157.

Gossett et al., Self Aligned Barrier Approach: Overview on Process, Module Integration and Interconnect Performance Improvement Challenges, Interconnect Technology Conference, Jun. 2006, p. 84-86.

U.S. Patent and Trademark Office, Non-final Office Action received in related U.S. Appl. No. 12/242,384 dated Aug. 21, 2009, 36pp.

Lee, H.B.R. et al., Low resistivity cobalt thin films prepared by plasma-enhanced atomic layer deposition, AVS 6th International Conference on Atomic Layer Deposition (ALD 2006), Seoul, South Korea, Jul. 24-26, 21pp.

* cited by examiner

DIFFUSION BARRIER AND ADHESION LAYER FOR AN INTERCONNECT STRUCTURE

CROSS-REFERENCE TO RELATED APPLICATIONS

This application is related to co-pending U.S. patent application Ser. No. 11/691,167 entitled "DIFFUSION BARRIER FOR INTEGRATED CIRCUITS FORMED FROM A LAYER OF A REACTIVE METAL AND METHOD OF FABRICATION", filed on Mar. 26, 2007. This application is related to co-pending U.S. patent application Ser. No. 12/242,384 entitled "METHOD FOR FORMING A DIFFUSION BARRIER AND ADHESION LAYER FOR AN INTERCONNECT STRUCTURE", filed on even date herewith. The entire contents of these applications are herein incorporated by reference in their entirety.

FIELD OF THE INVENTION

The invention relates generally to fabrication of interconnect structures within integrated circuits, and more particularly, to using a layer of cobalt metal for forming a diffusion barrier on dielectric materials within the interconnect structure and a cobalt nitride adhesion layer on the diffusion barrier.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other.

Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. Metal layers typically occupy etched pathways in the interlayer dielectric. A "via" normally refers to any feature such as a hole, line or other similar feature formed within a dielectric layer that provides an electrical connection through the dielectric layer to a conductive layer underlying the dielectric layer. Similarly, metal layers connecting two or more vias are normally referred to as trenches.

A long-recognized objective in the constant advancement of integrated circuit (IC) technology is the scaling down of IC dimensions. Such scale down of IC dimensions reduces area capacitance and is critical to obtaining higher speed performance of ICs. Moreover, reducing the area of an IC die leads to higher yield in IC fabrication. These advances are driving forces to constantly scale down IC dimensions. An increase in device performance is normally accompanied by a decrease in device area or an increase in device density. An increase in device density requires a decrease in via dimensions used to form interconnects, including a larger aspect ratio (i.e., depth to width ratio). As the minimum feature dimensions on patterned substrates (wafers) steadily decreases, several consequences of this downward scaling are becoming apparent. As the width of metal lines is scaled down to smaller submicron and even nanometer dimensions, electromigration failure, which may lead to open and extruded metal lines, is now a well-recognized problem. Moreover, as dimensions of metal lines further decrease, metal line resistance increases substantially, and this increase in line resistance may adversely affect circuit performance.

The introduction of copper (Cu) metal into multilayer metallization schemes for manufacturing integrated circuits is enabled by the damascene Cu plating process and is now extensively used by manufacturers of advanced microprocessors and application-specific circuits. Cu is known to easily diffuse into common integrated circuit materials such as silicon and dielectric materials where Cu is a mid-bandgap impurity. Therefore, a diffusion barrier material is formed onto dielectric materials and other materials in the integrated circuits to surround the Cu and prevent diffusion of the Cu into the integrated circuit materials.

SUMMARY OF THE INVENTION

An interconnect structure for an integrated circuit is provided. The interconnect structure contains an interconnect opening within a dielectric material having a diffusion barrier formed from a layer of cobalt (Co) metal that prevents diffusion of Cu metal in the interconnect opening into the dielectric material and a cobalt nitride adhesion layer on the diffusion barrier that provides good adhesion to the Cu metal. According to one embodiment, the interconnect structure may further include a Ru seed layer on the cobalt nitride adhesion layer.

According to one embodiment of the invention, the interconnect structure includes an interconnect opening formed within a dielectric material, a diffusion barrier on the dielectric material, where the diffusion barrier contains a compound from a thermal reaction between cobalt (Co) metal from at least a portion of a cobalt metal layer formed on the dielectric material and a dielectric reactant element from the dielectric material. The interconnect structure further includes a cobalt nitride adhesion layer in the interconnect opening, and a Cu metal fill in the interconnect opening, wherein the diffusion barrier and the cobalt nitride adhesion layer surround the Cu metal fill within the interconnect opening.

According to another embodiment of the invention, the interconnect structure includes an interconnect opening formed within a dielectric material, the interconnect opening comprising a trench, a via, or a dual damascene opening, and a conductive interconnect structure at the bottom of the interconnect opening, a diffusion barrier on the dielectric material, where the diffusion barrier contains a compound from a thermal reaction between cobalt metal from a first portion of a cobalt (Co) metal layer formed on the dielectric material and a dielectric reactant element from the dielectric material. The interconnect structure further includes a second portion of the cobalt metal layer on the diffusion barrier, a cobalt nitride adhesion layer on the second portion of the cobalt metal layer, and a copper (Cu) metal fill in the interconnect opening, wherein the diffusion barrier, the second portion of the cobalt metal layer, and the cobalt nitride adhesion layer surround the Cu metal fill within the interconnect opening.

DETAILED DESCRIPTION OF SEVERAL EMBODIMENTS OF THE INVENTION

Embodiments of the invention provide interconnect structures for integrated circuits and method of forming the interconnect structures. The interconnect structures include a cobalt compound diffusion barrier that prevents diffusion of Cu metal into a dielectric material in an interconnect opening and further contains a cobalt nitride adhesion layer on the diffusion barrier that provides good adhesion to the Cu metal and an optional Ru seed layer on the cobalt nitride adhesion layer.

Figure 1A:
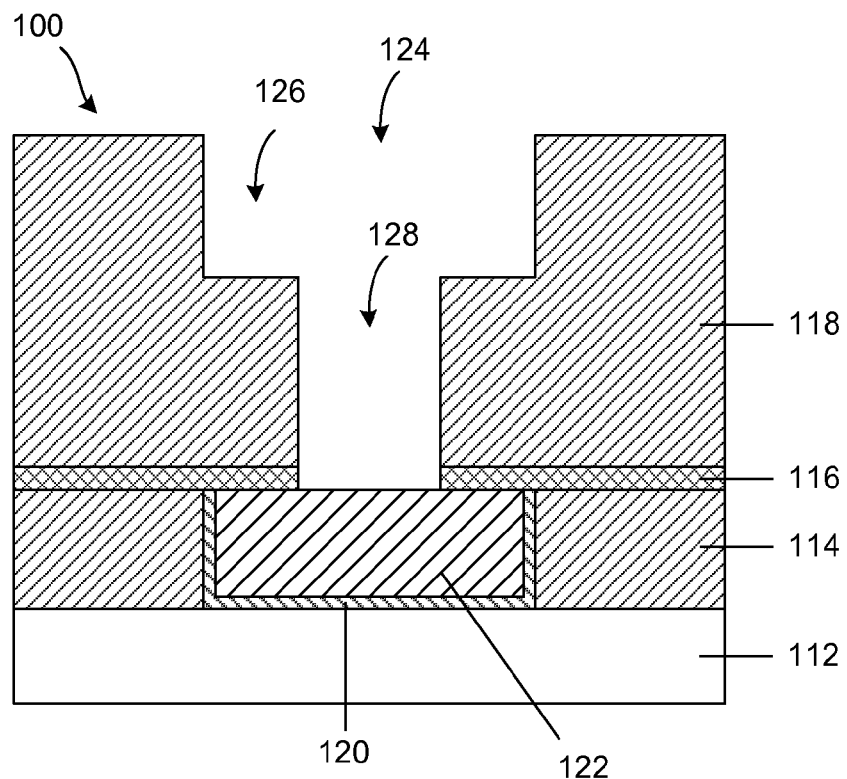
FIGS. 1A-1L schematically show cross-sectional views for forming interconnect structures containing dual damascene openings according to embodiments of the invention.

Referring now to the drawings, FIGS. 1A-1L schematically show cross-sectional views for forming interconnect structures containing dual damascene openings according to embodiments of the invention. FIG. 1A schematically shows a cross-sectional view of an interconnect structure 100 containing a dual damascene interconnect opening 124 formed over a conductive interconnect structure 122. Dual damascene interconnect openings are well known to one of ordinary skill in the art of integrated circuit fabrication. The interconnect opening 124 contains a via 128 and a trench 126 formed in dielectric material 118. The trench 126 may be utilized for an upper conductive interconnect structure and the via 128 may connect the trench 126 to the conductive interconnect structure 122. The interconnect structure 100 further contains dielectric layer 114, substrate layer 112, a barrier layer 120 surrounding the conductive interconnect structure 122, and an etch stop layer 116. The conductive interconnect structure 122 can, for example, contain Cu, tungsten (W), or aluminum (Al).

In FIG. 1A, the dielectric material 118 can contain $SiO_2$, SiON, SiN, or a low dielectric constant (low-k) material having a dielectric constant less than that of $SiO_2$ (k~3.9). The low-k material can contain simple or complex compounds of Si, C, or Si and C, in combination with O, N, H, and/or a halogen (F, Cl, Br, or I), either as dense or porous materials. Examples of low-k materials include C:F-containing materials and SiCOH and F—SiCOH materials.

Figure 1B:
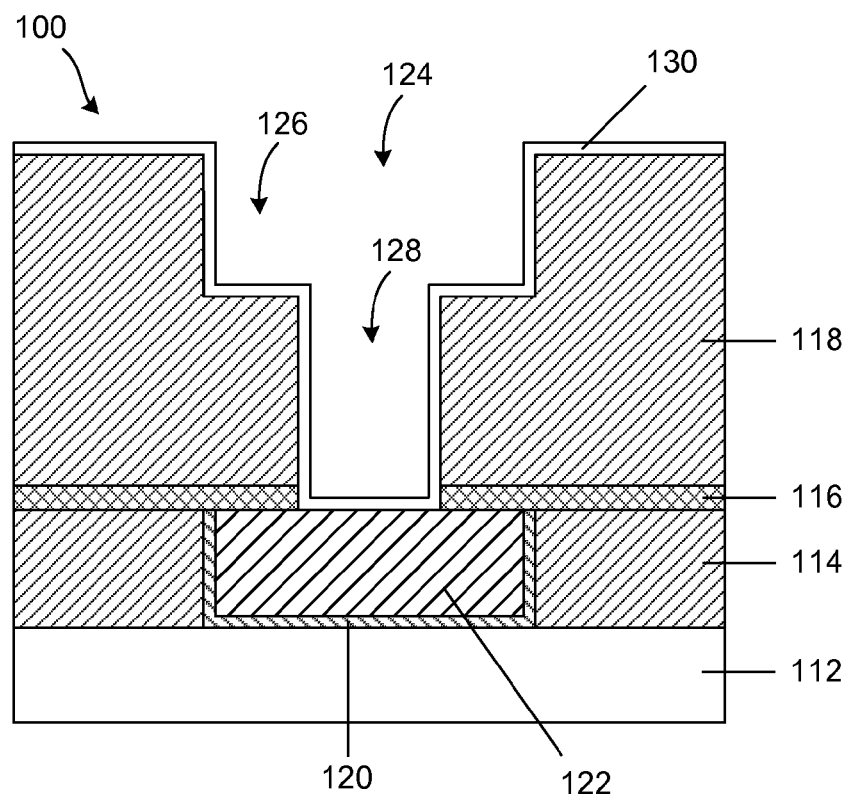

In FIG. 1B, a cobalt metal layer 130 is deposited over the interconnect structure 100, including in the interconnect opening 124 formed within the dielectric material 118 and onto the conductive interconnect structure 122 at the bottom of the interconnect opening 124. A thickness of the cobalt metal layer 130 can, for example, be about 3 nm ($nm=10^{-9}$ m), or less. In another example, the thickness can be about 2 nm, or less. The cobalt metal layer 130 may be deposited by a variety of different deposition methods known to one of ordinary skill in the art, including, but not limited to, sputtering or physical vapor deposition (PVD), chemical vapor deposition (CVD), pulsed CVD, plasma-enhanced CVD (PECVD), atomic layer deposition (ALD), or plasma-enhanced ALD (PEALD). According to one embodiment of the invention, the cobalt metal layer 130 may be deposited by a non-plasma process, e.g., CVD, pulsed CVD, or ALD, to avoid plasma damage to the interconnect structure 100.

Figure 1C:
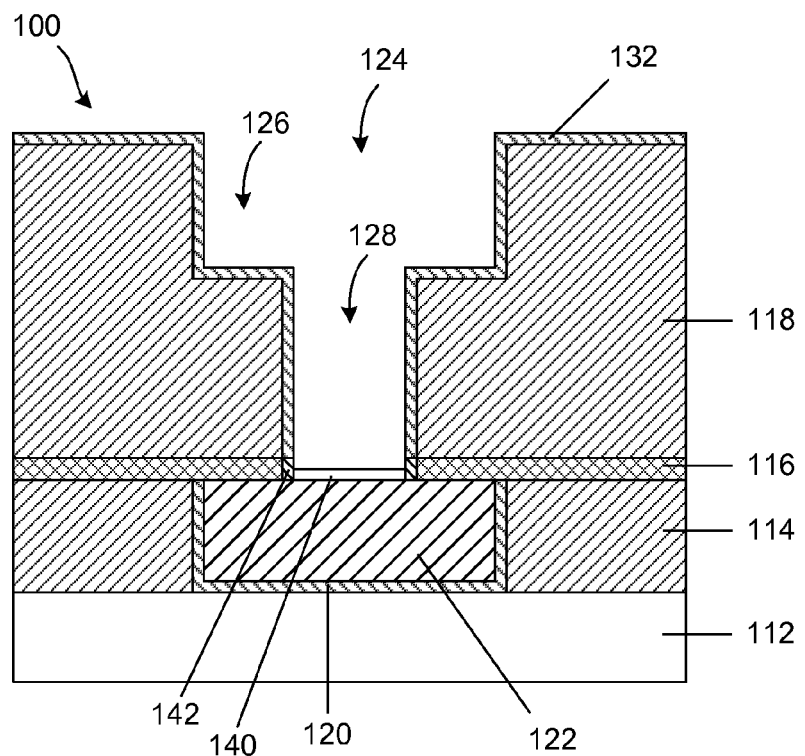

Referring to FIG. 1C, a thermal anneal process may be performed by heating the interconnect structure 100 to a temperature between about 100° C. and about 600° C. for a time period between about 1 minute and about 60 minutes. According to one embodiment of the invention, the thermal anneal process may be performed by heating the interconnect structure 100 to a temperature of about 400° C., or less, and maintaining the interconnect structure at that temperature for a time period of less than about 5 minutes. The thermal anneal process may be performed under vacuum conditions with or without the use of an inert gas. Alternately, the thermal anneal process may be performed under vacuum conditions in the presence of hydrogen ($H_2$) and optionally an inert gas. The vacuum conditions can include gas pressure less than or equal to 760 Torr, less than 10 Torr, less than 1 Torr, or less than 1 mTorr.

During the thermal anneal process, a diffusion barrier 132 is formed from reaction of cobalt metal from cobalt metal layer 130 with a dielectric reactant element from the dielectric material 118. According to an embodiment of the invention, the dielectric reactant element can include Si, O, N, C, or a halogen, or a combination thereof. According to another embodiment, the dielectric material 118 can contain a SiCOH material and the dielectric reactant element can include Si, O, or C, or a combination thereof. According to another embodiment, the dielectric material can contain a F—SiCOH material and the dielectric reactant element can include, Si, O, C, or F, or a combination thereof. The diffusion barrier 132 formed by the thermal anneal process can contain a cobalt silicide, a cobalt silicate, a cobalt silicon oxynitride, a cobalt oxide, a cobalt nitride, a cobalt carbide, or a cobalt halide, or a combination thereof.

In the embodiment depicted in FIG. 1C, the reaction of the cobalt metal from the cobalt metal layer 130 with a dielectric reactant element from the dielectric material 118 consumes substantially the entire cobalt metal layer 130 in contact with the dielectric material 118. According to one embodiment of the invention, the diffusion barrier 132 is an amorphous layer of a cobalt compound. Furthermore, FIG. 1C depicts a portion 142 of the cobalt metal layer 130 on the etch stop layer 116. The portion 142 may contain unreacted cobalt metal if the cobalt metal does not react with the etch stop layer 116, or the portion 142 may contain a compound formed from a reaction between the cobalt metal layer 130 and the etch stop layer 116. FIG. 1C further shows a portion 140 of the cobalt metal layer 130 at the bottom of the via 128 in contact with the conductive interconnect structure 122. The portion 140 may consist of cobalt metal or the portion 140 may contain a mixture formed by diffusion between the cobalt metal layer 130 and the conductive interconnect structure 122. For example, the portion 140 may contain a cobalt copper mixture or a cobalt tungsten mixture.

The diffusion barrier 132 may primarily contain a compound formed from the thermal reaction between the cobalt metal layer 130 and the dielectric reactant element from the dielectric material 118. In other words, formation of the diffusion barrier 132 may be dominated by the interaction between the cobalt metal layer 130 and the dielectric material 118. However, other embodiments of the invention do not preclude utilizing a process gas containing one or more of the same elements as the dielectric reactant elements from the dielectric material 118 (e.g., Si, O, N, C, or a halogen) during the thermal anneal process to further incorporate these elements into the cobalt metal layer 130 to form diffusion barrier compounds. For example, the process gas can contain a silicon precursor (e.g., $SiH_4$, $SiCl_4$, or $Si_2Cl_6$), an oxygen precursor (e.g., $O_2$ or $H_2O$), a nitrogen precursor (e.g., $NH_3$ or $N_2H_4$), an oxygen- and nitrogen-precursor (e.g., NO, $NO_2$, $N_2O$), or a halogen-precursor (e.g., $Cl_2$).

Diffusion barrier compounds formed from the cobalt metal in the cobalt metal layer 130 and an element of a process gas can comprise a minor proportion relative to the diffusion barrier compounds formed from the cobalt metal in the cobalt metal layer 130 and the dielectric reactant element from the dielectric material 118. In one embodiment, diffusion barrier compounds formed from the cobalt metal in the cobalt metal layer 130 and an element of a process gas comprise less than 30% of the diffusion barrier 132. In another embodiment, diffusion barrier compounds formed from the cobalt metal in the cobalt metal layer 130 and an element of a process gas comprise less than 20% of the diffusion barrier 132. In yet another embodiment, diffusion barrier compounds formed from the cobalt metal in cobalt metal layer 130 and an element of a process gas comprise less than 10% of the diffusion barrier 132.

Figure 1D:
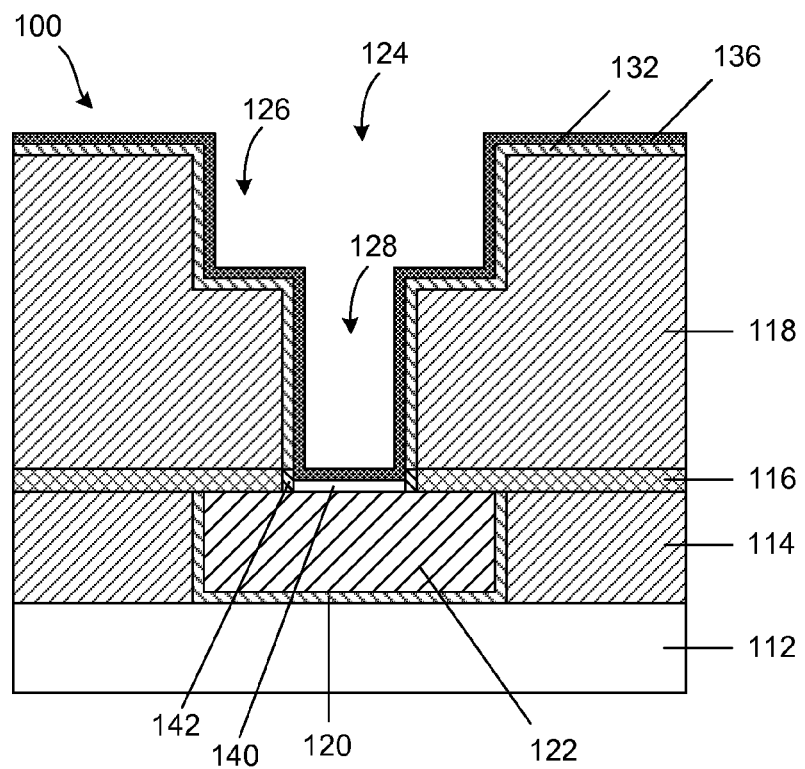

FIG. 1D shows a cobalt nitride adhesion layer 136 deposited on the diffusion barrier 132 and on the portion 140 of the cobalt metal layer 130 on the conductive interconnect structure 122 at the bottom of the via 128 by exposing the interconnect structure 100 to a deposition gas. The cobalt nitride adhesion layer 136 may be deposited by a variety of different deposition methods known to one of ordinary skill in the art, including, but not limited to, sputtering or PVD, CVD, pulsed CVD, PECVD, ALD, or PEALD. According to one embodiment of the invention, the cobalt nitride adhesion layer 136 may be deposited by a non-plasma process, e.g., CVD, pulsed CVD, or ALD, to avoid plasma damage to the interconnect structure 100.

Figure 1E:
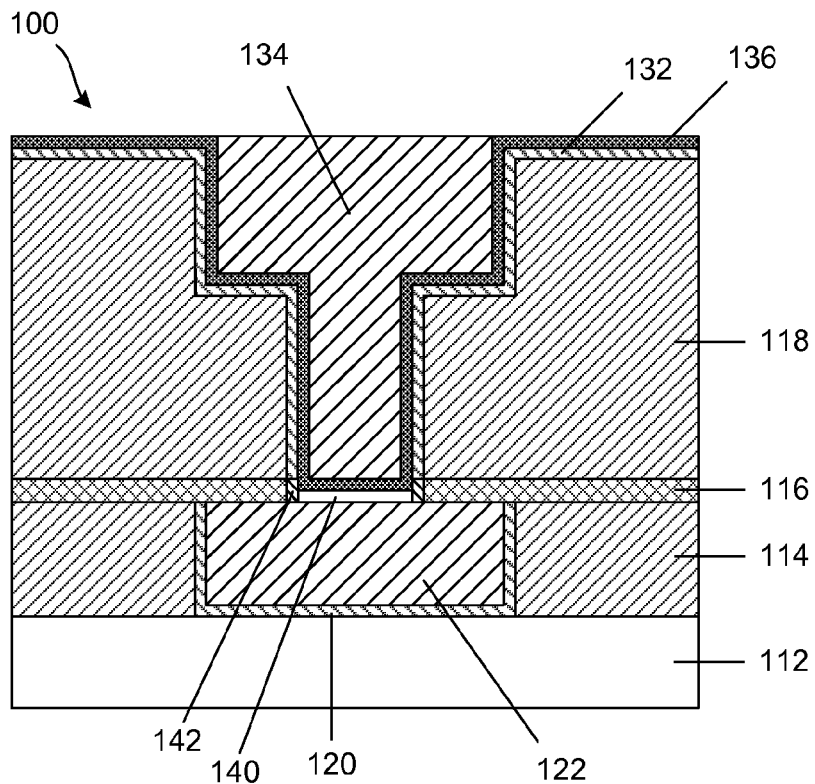

In FIG. 1E, the interconnect opening 124 is filled with Cu metal 134. Cu filling processes are known to one of ordinary skill in the art of circuit fabrication and can, for example, include an electrochemical plating process or an electroless plating process. A Cu seed layer may be deposited in the interconnect opening 124 prior to the Cu filling. A Cu filling process may be followed by a planarizing process such as chemical mechanical polishing (CMP). The Cu metal 134 is surrounded by the diffusion barrier 132 and the cobalt nitride adhesion layer 136 within the interconnect opening 124.

Figure 1F:
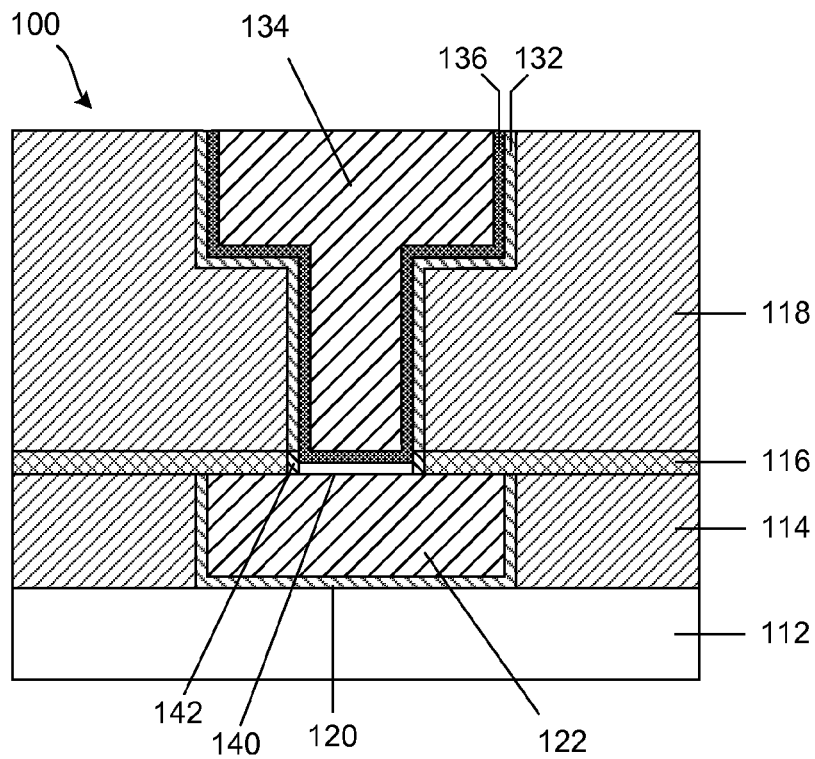

Although FIG. 1E shows the diffusion barrier 132 and the cobalt nitride adhesion layer 136 present on the field area of the dielectric material 118, those skilled in the art will readily realized that the planarized structure depicted in FIG. 1E may be further planarized to remove all material layers from the field area of the dielectric material 118 prior to further processing. A further planarized interconnect structure 100 is schematically shown in FIG. 1F. This further planarization may be applied to all the interconnect structures depicted in FIGS. 1-6 following Cu filling.

According to one embodiment of the invention, a Ru seed layer 138 may be deposited onto the cobalt nitride adhesion layer 136 prior to the Cu filling process. This is schematically shown in the interconnect structure 101 in FIG. 1G. For example, the Ru seed layer 138 may be deposited by sputtering or a CVD process using a $Ru_3(CO)_{12}$ precursor.

According to one embodiment of the invention, the portion 140 of the cobalt metal layer 130 at the bottom of the via 128 depicted in FIG. 1C may be removed by a sputter etch process or by a chemical etch process prior to depositing cobalt nitride adhesion layer 136 and filling the interconnect opening 124 with Cu metal 134. This is schematically shown as interconnect structure 102 in FIG. 1H. Removal of the portion 140 of the cobalt metal layer 130 from the bottom of the via 128 reduces the electrical resistance between the Cu metal 134 and the conductive interconnect structure 122. The chemical etch process may include a dry etch process or a wet etch process. In one example, a chemical etch process may be utilized that has a higher etch rate for the portion 140 than for the diffusion barrier 132. For example, in the case of a cobalt silicide (CoSi) diffusion barrier 132, a mixture of $NH_4OH$ and $H_2O_2$ may be utilized for selectively removing the portion 140 at the bottom of the via 128. According to another embodiment of the invention, a Ru seed layer 138 may be deposited onto the cobalt nitride adhesion layer 136 prior to a Cu filling process. This is schematically shown as interconnect structure 103 in FIG. 1I.

Referring back to FIG. 1D, according to another embodiment of the invention, both the portion 140 of the cobalt metal layer 130 and the cobalt nitride adhesion layer 136 at the bottom of the via 128 may be removed by an etch process prior to a Cu filling process. This is schematically shown as interconnect structure 104 in FIG. 1J, where the Cu metal 134 is in direct contact with the conductive interconnect structure 122. According to another embodiment of the invention, a Ru seed layer 138 may be deposited prior to a Cu filling process. This is schematically shown in the interconnect structure 105 in FIG. 1K. According to yet another embodiment, the Ru seed layer 138 at the bottom of the via 128 may be removed by an etch process prior to filling the interconnect opening 124 with Cu metal 134. This is schematically shown in the interconnect structure 106 in FIG. 1L, where the Cu metal 134 is in direct contact with the conductive interconnect structure 122.

Figure 2A:
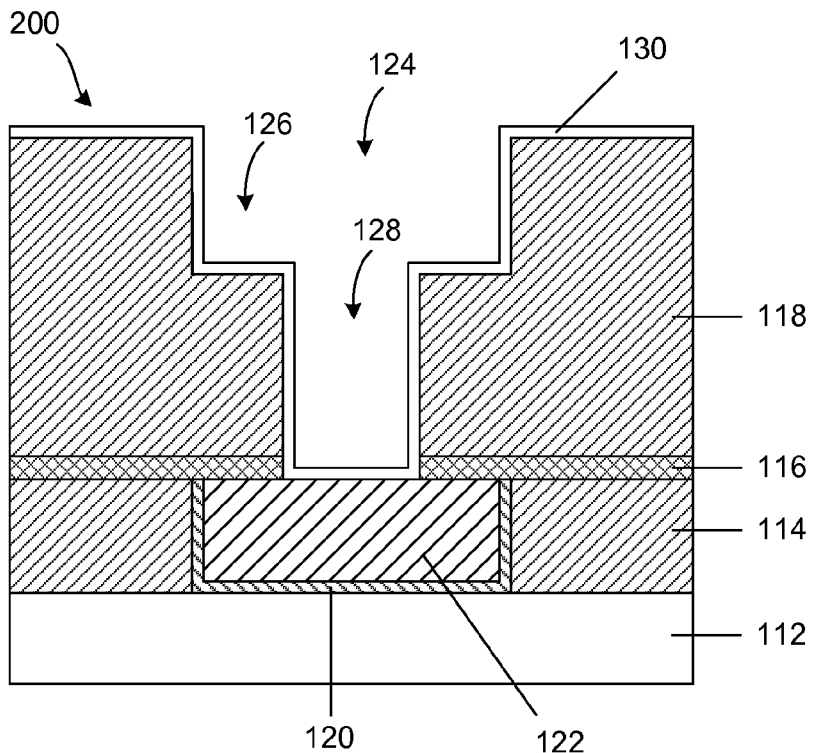
FIGS. 2A-2C schematically show cross-sectional views for forming an interconnect structure containing a dual damascene opening according to an additional embodiment of the invention.
Figure 2B:
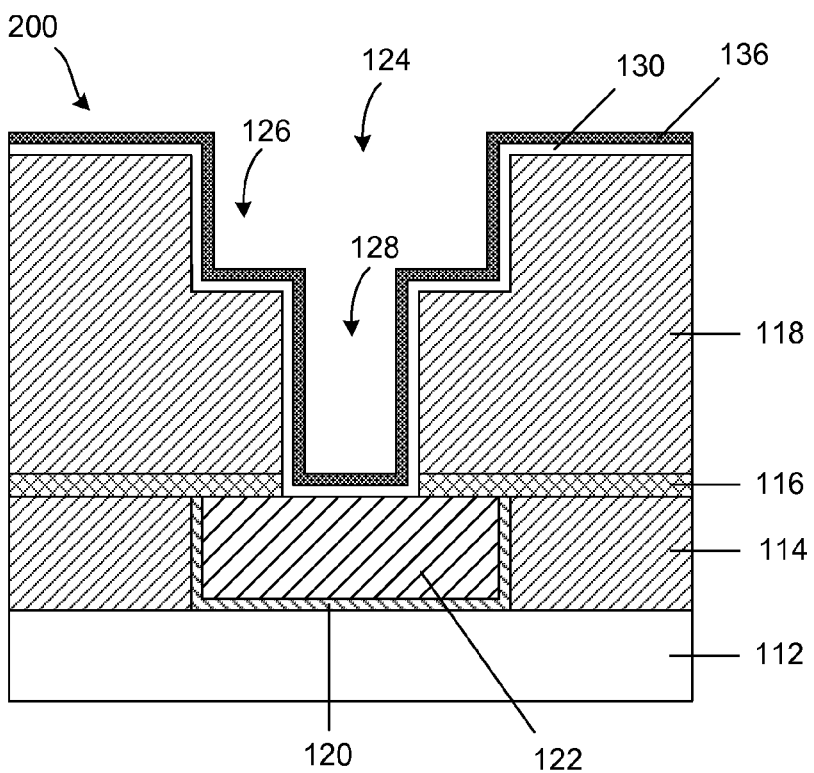
Figure 2C:
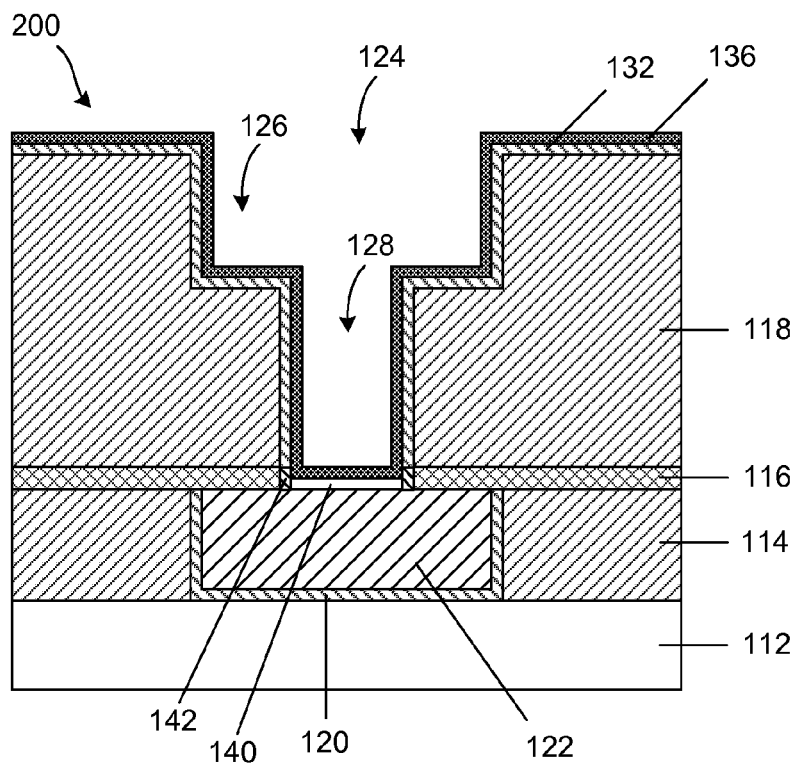

FIGS. 2A-2C schematically show cross-sectional views for forming an interconnect structure containing a dual damascene opening according to an additional embodiment of the invention. FIG. 2A schematically shows cobalt metal layer 130 deposited over the interconnect structure 200, including in the interconnect opening 124 formed within the dielectric material 118 and onto the conductive interconnect structure 122 at the bottom of the interconnect opening 124. The cobalt metal layer 130 may be deposited as described above for FIG. 1B.

FIG. 2B schematically shows a cobalt nitride adhesion layer 136 deposited on the cobalt metal layer 130. The cobalt nitride adhesion layer 136 may be deposited as described above for FIG. 1D.

FIG. 2C schematically shows interconnect structure 200 following a thermal anneal process where diffusion barrier 132 is formed from reaction of cobalt metal from cobalt metal layer 130 with a dielectric reactant element from the dielectric material 118. The thermal anneal process may be performed as described above for FIG. 1C. Furthermore, FIG. 2C depicts a portion 142 of the cobalt metal layer 130 on the etch stop layer 116, and a portion 140 of the cobalt metal layer 130 at the bottom of the via 128 in contact with the conductive interconnect structure 122. The portions 142 and 140 were described above in FIG. 1C.

According to embodiments of the invention, the interconnect structure 200 shown in FIG. 2C may be further processed as described above in reference to FIGS. 1E-1F.

Figure 1G:
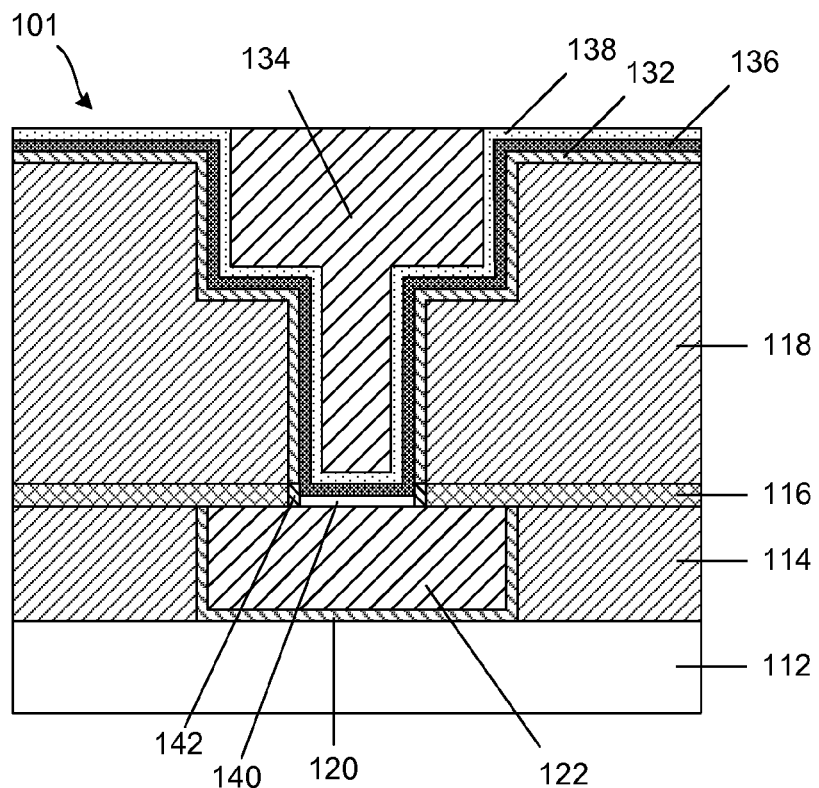

According to another embodiment, the interconnect structure 200 shown in FIG. 2C may further include a Ru seed layer 138 deposited on the cobalt nitride adhesion layer 136 prior to a Cu filling process. The resulting structure is schematically shown in FIG. 1G.

Figure 1H:
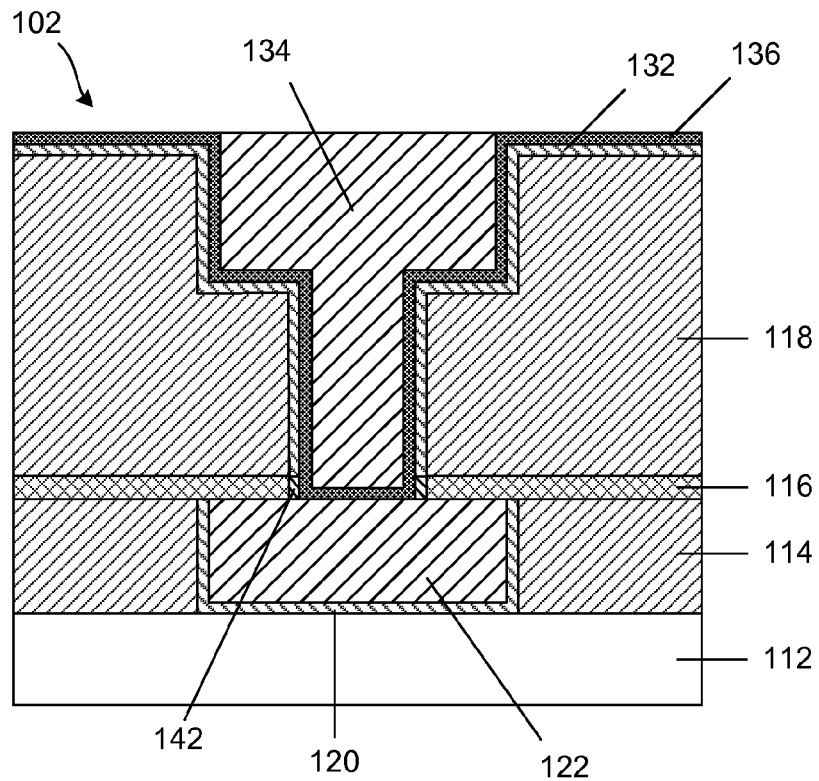
Figure 1I:
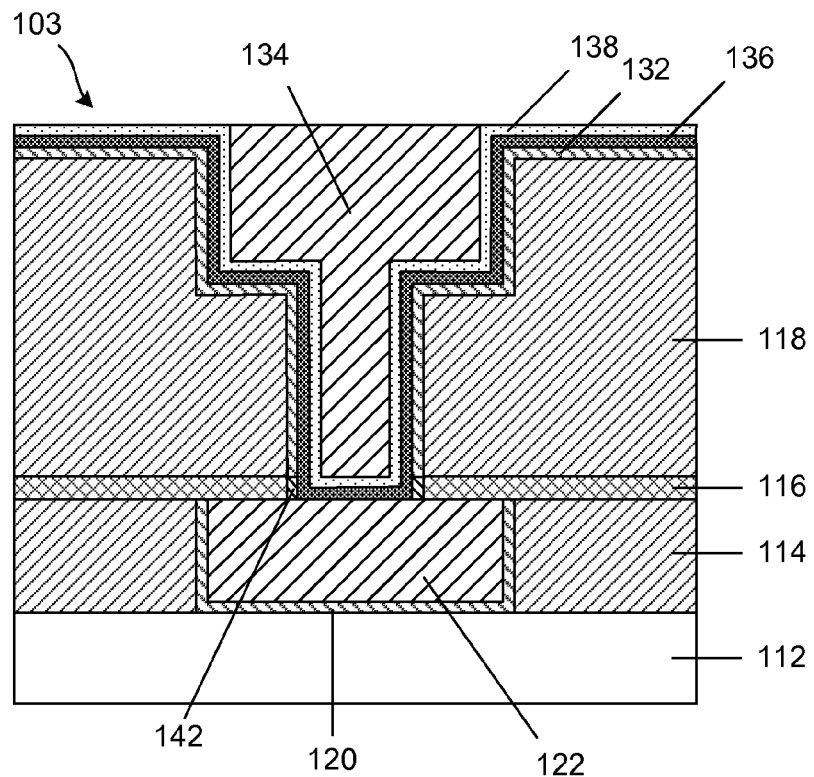

Still referring to the interconnect structure 200, according to yet another embodiment, the cobalt metal layer 130 at the bottom of the via 128 depicted in FIG. 2A may be removed by a sputter etch process or by a chemical etch process prior to depositing the cobalt nitride adhesion layer 136, the thermal annealing, and filling the interconnect opening 124 with Cu metal 134. The resulting structure is schematically shown in FIG. 1H. According to another embodiment of the invention, following the removal of the cobalt metal layer 130 from the bottom of the via 128 and subsequent deposition of the cobalt nitride adhesion layer 136, a Ru seed layer 138 may be deposited onto the cobalt nitride adhesion layer 136 prior to the Cu filling process. The resulting structure is schematically shown in FIG. 1I.

Figure 1J:
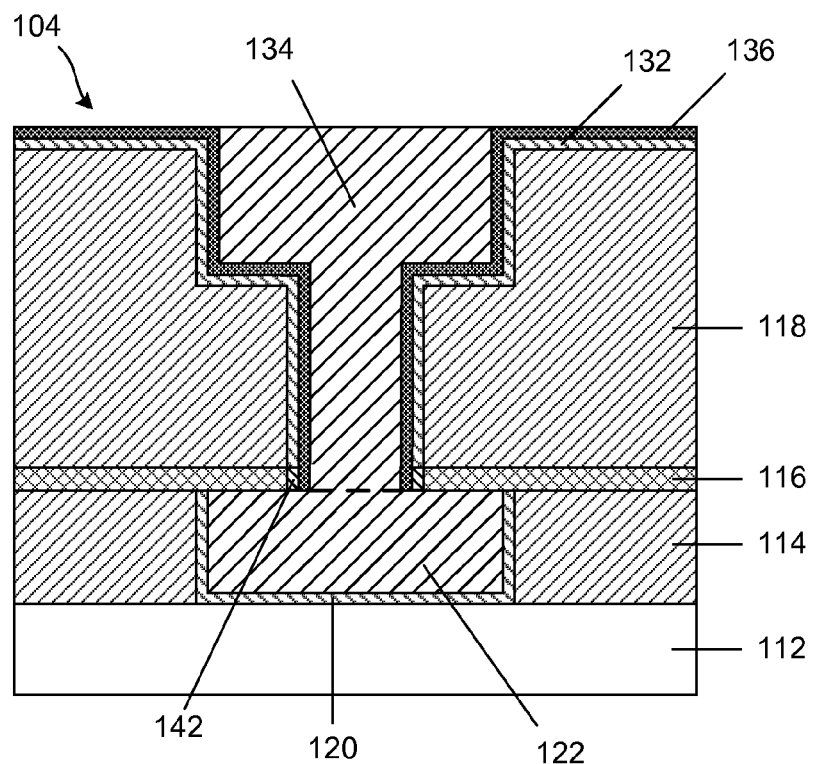
Figure 1K:
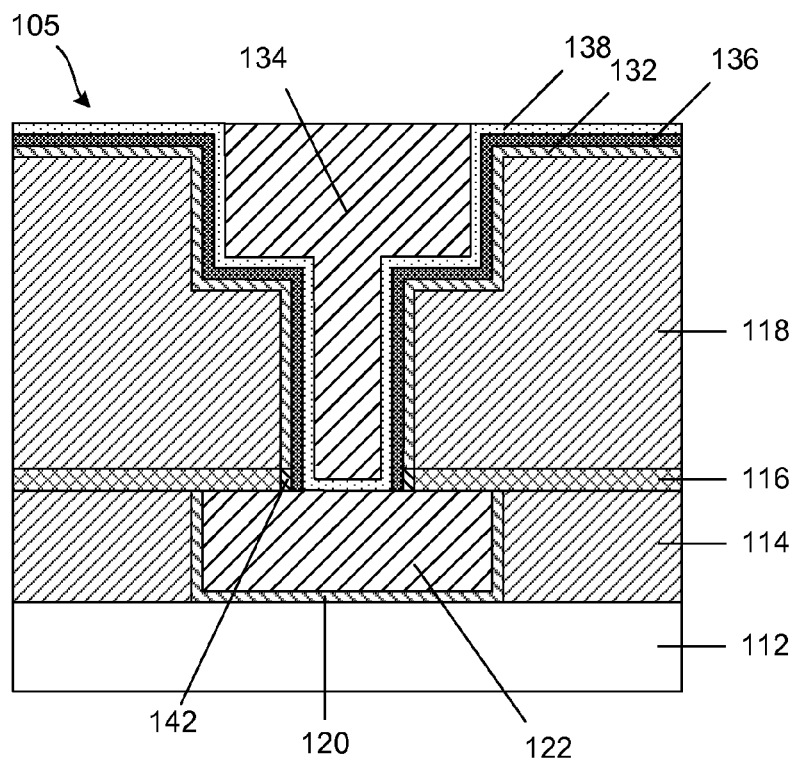
Figure 1L:
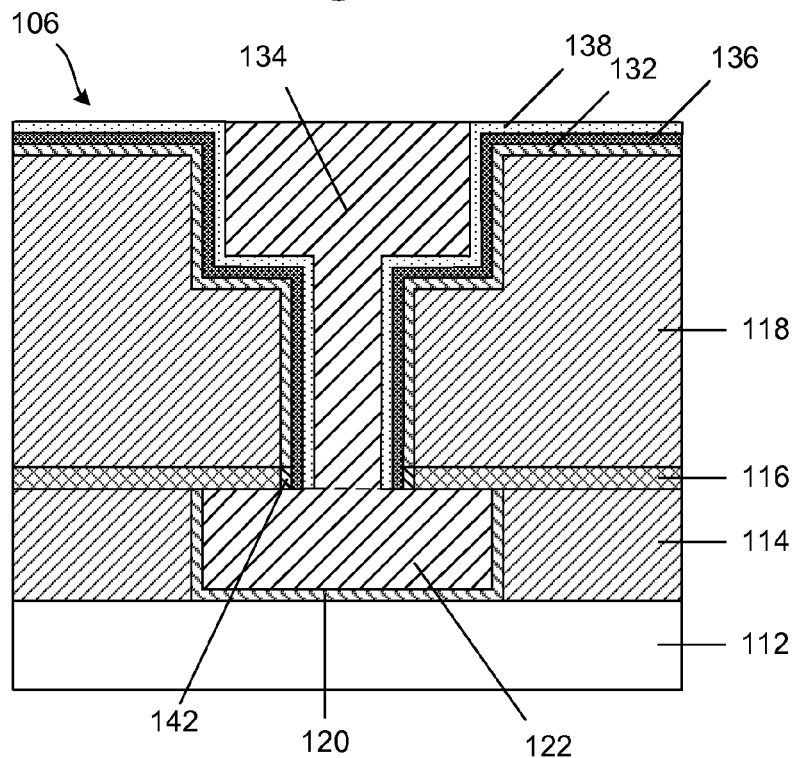

Still referring to the interconnect structure 200, according to yet another embodiment of the invention, the portion 140 of the cobalt metal layer 130 and the cobalt nitride adhesion layer 136 at the bottom of the via 128 in FIG. 2C may be removed by an etch process prior to a Cu filling process, such that the Cu metal 134 is in direct contact with the conductive interconnect structure 122. The resulting structure is schematically shown in FIG. 1J. According to another embodiment of the invention, following the removal of the portion 140 of the cobalt metal layer 130 and the cobalt nitride adhesion layer 136 from the bottom of the via 128, a Ru seed layer 138 may be deposited in the interconnect opening prior to a Cu filling process. The resulting structure is schematically shown in FIG. 1K. According to yet another embodiment, the Ru seed layer 138 may be removed from the bottom of the via 128 by an etch process prior to filling the interconnect opening 124 with Cu metal 134, such that the Cu metal 134 is in direct contact with the conductive interconnect structure 122. The resulting structure is schematically shown in FIG. 1L.

Figure 3A:
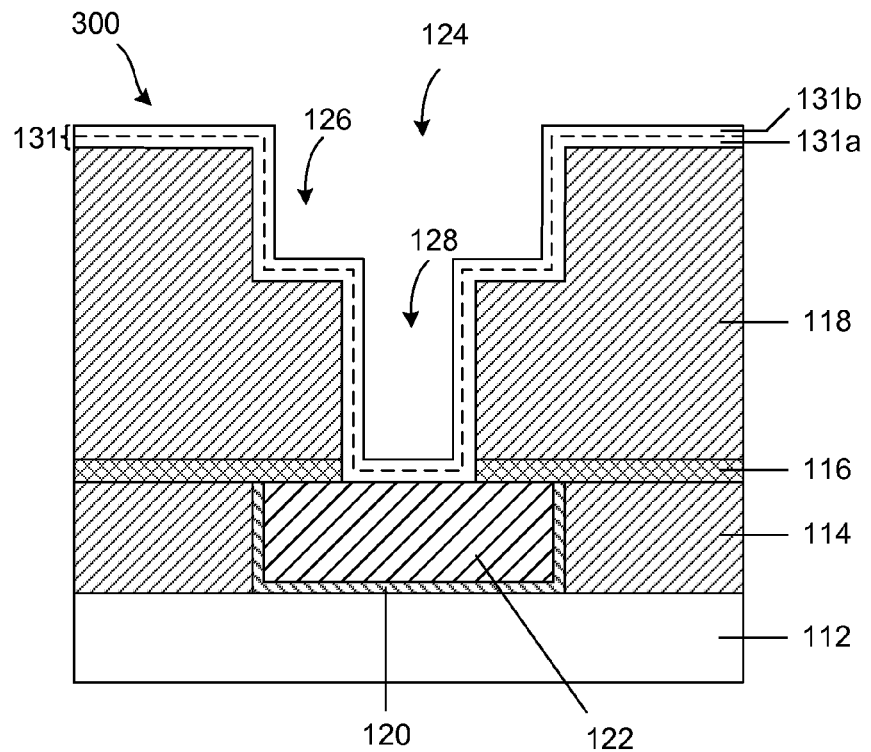
FIGS. 3A-3C schematically show cross-sectional views for forming an interconnect structure containing a dual damascene opening according to an embodiment of the invention.
Figure 3B:
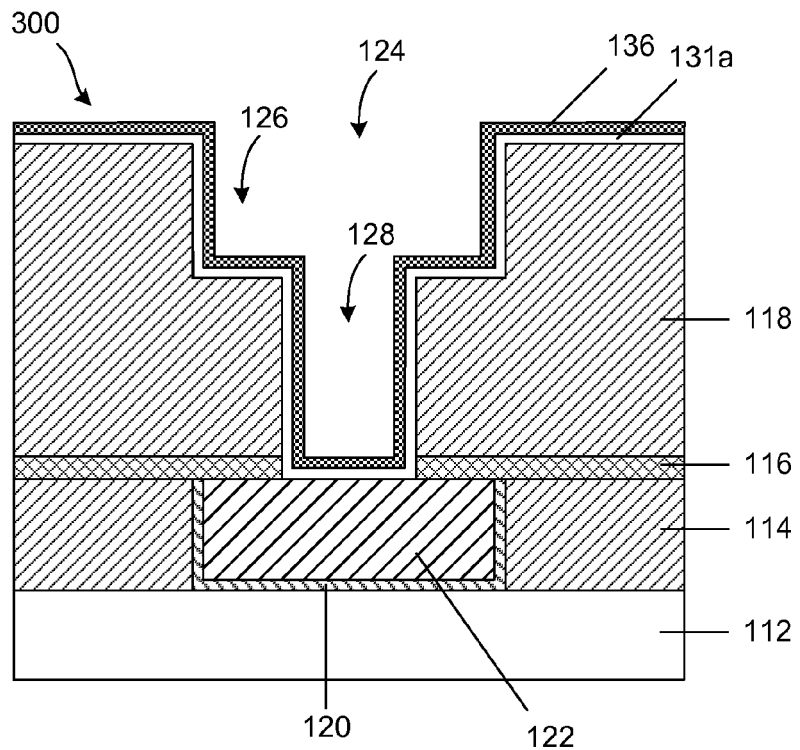
Figure 3C:
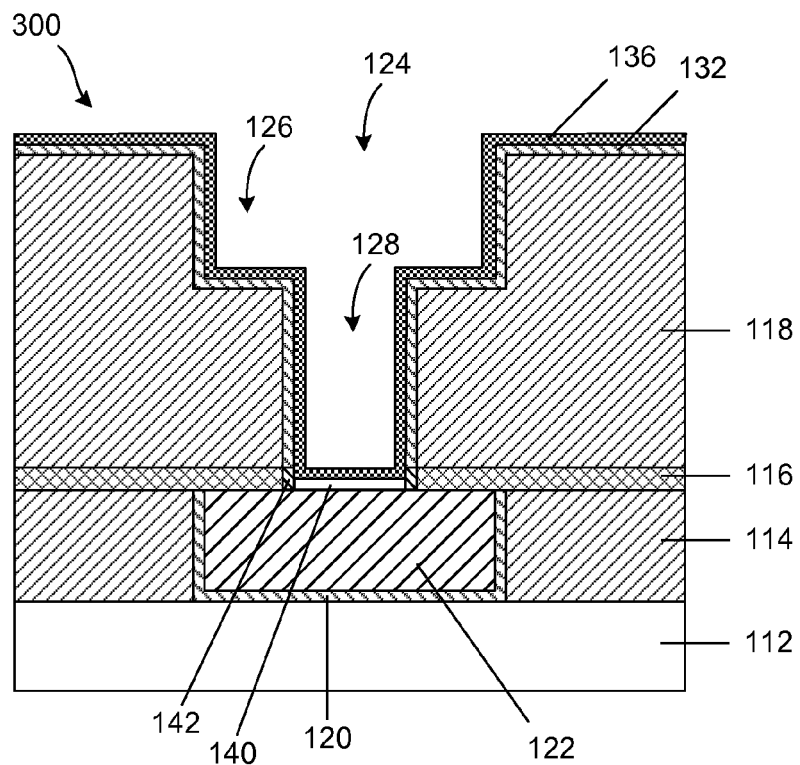

FIGS. 3A-3C schematically show cross-sectional views for forming an interconnect structure containing a dual damascene opening according to an embodiment of the invention. FIG. 3A schematically shows a cross-sectional view of an interconnect structure 300 containing a cobalt metal layer 131 deposited in the interconnect opening 124. The cobalt metal layer 131 contains a first portion 131a in contact with the dielectric material 118 and the conductive interconnect structure 122, and a second portion 131b on the first portion 131a. In one example, the cobalt metal layer 131 may be thicker than the cobalt metal layer 130 shown in FIG. 1B. In FIG. 3B, the second portion 131b may be nitrided by exposing the second portion 131b to a nitriding gas to form cobalt nitride adhesion layer 136, where the first portion 131a on the dielectric material 118 remains substantially unreacted during the nitriding process. For example, the nitriding gas can comprise plasma excited $N_2$ gas, plasma excited $N_2$ and $H_2$ gas, plasma excited $NH_3$ gas, or non-plasma excited $NH_3$ gas.

In FIG. 3C, the first portion 131a is thermally reacted with at least a portion of the dielectric material 118 where diffusion barrier 132 is formed from reaction of cobalt metal from the first portion 131a with a dielectric reactant element from the dielectric material 118. Furthermore, FIG. 3C depicts a portion 142 of the first portion 131a on the etch stop layer 116, and a portion 140 of the first portion 131a at the bottom of the via 128 in contact with the conductive interconnect structure 122. The portion 142 may contain unreacted cobalt metal if the cobalt metal does not react with the etch stop layer 116, or the portion 142 may contain a compound formed from a reaction between the first portion 131a and the etch stop layer 116. The portion 140 may consist of cobalt metal or the portion 140 may contain a mixture formed by diffusion between the first portion 131a and the conductive interconnect structure 122. For example, the portion 140 may contain a cobalt copper mixture or a cobalt tungsten mixture.

According to embodiments of the invention, the interconnect structure 300 shown in FIG. 3C may be further processed as described above in reference to FIGS. 1E-1F.

According to another embodiment, the interconnect structure 300 shown in FIG. 3C may further include a Ru seed layer 138 deposited on the cobalt nitride adhesion layer 136 prior to a Cu filling process. The resulting structure is schematically shown in FIG. 1G.

Still referring to the interconnect structure 300 in FIG. 3C, according to yet another embodiment, the portion 140 of the first portion 131a at the bottom of the via 128 may be removed by a sputter etch process or by a chemical etch process prior to depositing the cobalt nitride adhesion layer 136, the thermal annealing, and filling the interconnect opening 124 with Cu metal 134. The resulting structure is schematically shown in FIG. 1H. According to another embodiment of the invention, following the removal of the portion 140 and subsequent deposition of the cobalt nitride adhesion layer 136, a Ru seed layer 138 may be deposited onto the cobalt nitride adhesion layer 136 prior to a Cu filling process. The resulting structure is schematically shown in FIG. 1I.

Still referring to the interconnect structure 300 in FIG. 3C, according to yet another embodiment of the invention, the portion 140 of the first portion 131a and the cobalt nitride adhesion layer 136 at the bottom of the via 128 may be removed by an etch process prior to a Cu filling process, such that the Cu metal 134 is in direct contact with the conductive interconnect structure 122. The resulting structure is schematically shown in FIG. 1J. According to another embodiment of the invention, following the removal of the portion 140 and cobalt nitride adhesion layer 136 from the bottom of the via 128, a Ru seed layer 138 may be deposited in the interconnect opening prior to the Cu filling process. The resulting structure is schematically shown in FIG. 1K. According to yet another embodiment, the Ru seed layer 138 may be removed from the bottom of the via 128 by an etch process prior to filling the interconnect opening 124 with Cu metal 134, such that the Cu metal 134 is in direct contact with the conductive interconnect structure 122. The resulting structure is schematically shown in FIG. 1L.

Figure 4A:
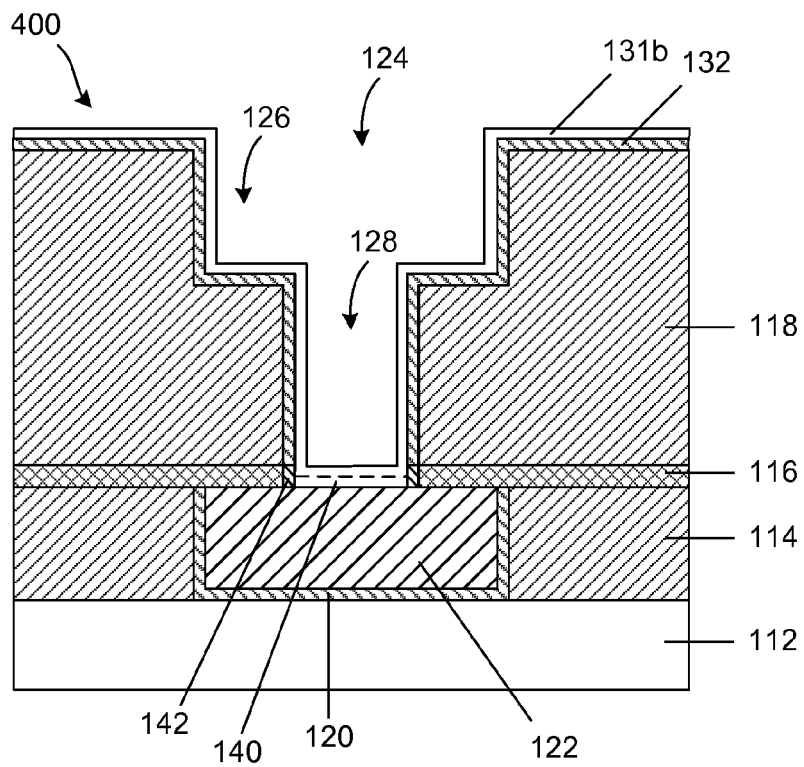
FIGS. 4A-4C schematically cross-sectional views for forming an interconnect structure containing a dual damascene opening according to embodiments of the invention.
Figure 4B:
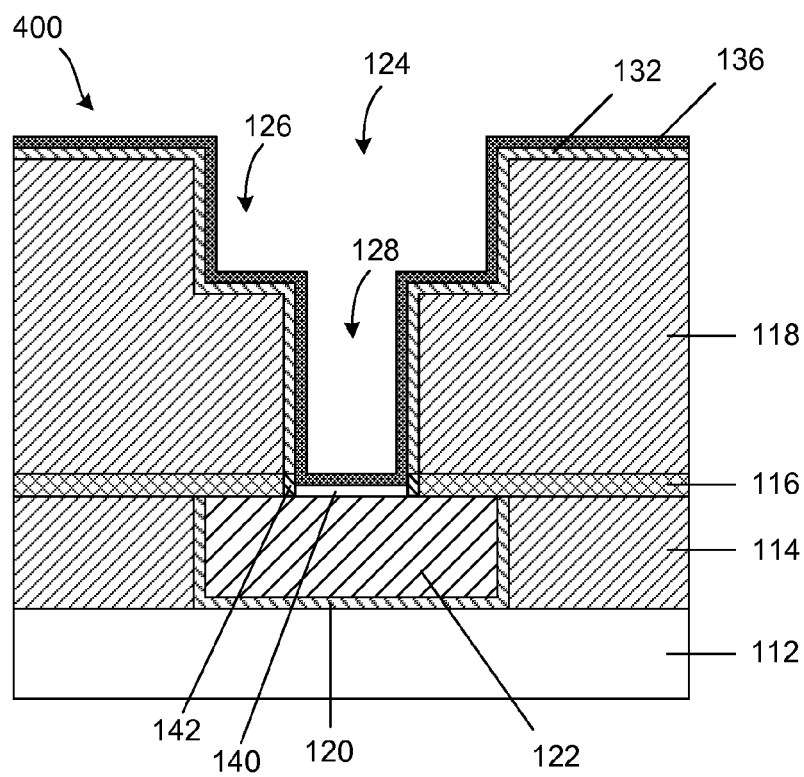
Figure 4C:
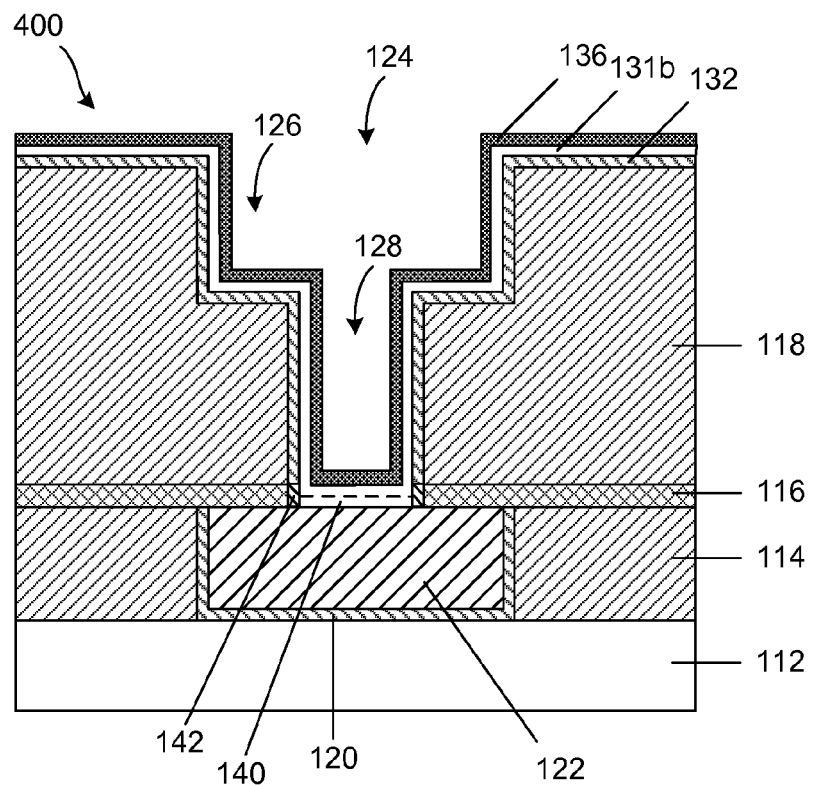

FIGS. 4A-4C schematically cross-sectional views for forming an interconnect structure containing a dual damascene opening according to embodiments of the invention. Referring back to FIG. 3A, a cross-sectional view of an interconnect structure 300 containing a cobalt metal layer 131 deposited in the interconnect opening 124 is schematically shown. The cobalt metal layer 131 contains a first portion 131a in contact with the dielectric material 118 and a second portion 131b on the first portion 131a.

In FIG. 4A, the first portion 131a is thermally reacted with at least a portion of the dielectric material where diffusion barrier 132 is formed from reaction of cobalt metal from the first portion 131a with a dielectric reactant element from the dielectric material 118. Furthermore, FIG. 4A depicts a portion 142 of the first portion 131a on the etch stop layer 116, and a portion 140 of the first portion 131a at the bottom of the via 128 in contact with the conductive interconnect structure 122. The portions 142 and 140 were described above in FIG. 3C.

In FIG. 4B, the second portion 131b of the cobalt metal layer 131 may be nitrided by exposing the second portion 131b to a nitriding gas to form cobalt nitride adhesion layer 136 on the diffusion barrier 132. For example, the nitriding gas can comprise plasma excited $N_2$ gas, plasma excited $NH_3$ gas, or non-plasma excited $NH_3$ gas.

According to embodiments of the invention, the interconnect structure 400 shown in FIG. 4B may be further processed as described above in reference to FIGS. 1E-1F.

According to another embodiment, the interconnect structure 400 schematically shown in FIG. 4B may further include a Ru seed layer 138 deposited on the cobalt nitride adhesion layer 136 prior to a Cu filling process. The resulting structure is schematically shown in FIG. 1G.

Still referring to the interconnect structure 400 in FIG. 4B, according to yet another embodiment, the portion 140 of the at the bottom of the via 128 may be removed by a sputter etch process or by a chemical etch process prior to nidriding the second portion 131b and filling the interconnect opening 124 with Cu metal. The resulting structure is schematically shown in FIG. 1H. According to another embodiment of the invention, following the removal of the portion 140 and subsequent nidriding of the second portion 131b, a Ru seed layer 138 may be deposited onto the cobalt nitride adhesion layer 136 prior to a Cu filling process. The resulting structure is schematically shown in FIG. 1I.

Still referring to the interconnect structure 400 in FIG. 4B, according to yet another embodiment of the invention, the portion 140 and the cobalt nitride adhesion layer 136 at the bottom of the via 128 may be removed by an etch process prior to a Cu filling process, such that the Cu metal 134 is in direct contact with the conductive interconnect structure 122. The resulting structure is schematically shown in FIG. 1J. According to another embodiment of the invention, following the removal of the portion 140 and the cobalt nitride adhesion layer 136 from the bottom of the via 128, a Ru seed layer 138 may be deposited in the interconnect opening 124 prior to a Cu filling process. The resulting structure is schematically shown in FIG. 1K. According to yet another embodiment, the Ru seed layer 138 may be removed from the bottom of the via 128 by an etch process prior to filling the interconnect opening 124 with Cu metal 134, such that the Cu metal 134 is in direct contact with the conductive interconnect structure 122. The resulting structure is schematically shown in FIG. 1L.

According to another embodiment of the invention, the nitriding process depicted in FIG. 4B may be replaced by cobalt nitride deposition process where cobalt nitride adhesion layer 136 is deposited on the second portion 131b by exposure to a deposition gas. The resulting interconnect structure 400 is shown in FIG. 4C and contains diffusion barrier 132, second portion 131b of the cobalt metal layer 131 on the diffusion barrier 132 and on the portion 140, and cobalt nitride adhesion layer 136 on the second portion 131b.

According to embodiments of the invention, the interconnect structure 400 shown in FIG. 4C may be further processed as described above in reference to FIGS. 1E-1F.

According to another embodiment, the interconnect structure 400 schematically shown in FIG. 4C may further include a Ru seed layer (not shown) deposited on the cobalt nitride adhesion layer 136 prior to a Cu filling process.

Still referring to the interconnect structure 400 in FIG. 4C, according to yet another embodiment, the second portion 131b of the cobalt metal layer 131 at the bottom of the via 128 and the portion 140 may be removed by a sputter etch process or by a chemical etch process prior to depositing the cobalt nitride adhesion layer 136, and filling the interconnect opening 124 with Cu metal(not shown). According to another embodiment of the invention, following the removal of the second portion 131b from the bottom of the via 128, following removal of the portion 140, and subsequent deposition of the cobalt nitride adhesion layer 136, a Ru seed layer (not shown) may be deposited onto the cobalt nitride adhesion layer 136 prior to a Cu filling process.

Still referring to the interconnect structure 400 in FIG. 4C, according to yet another embodiment of the invention, the portion 140 and the cobalt nitride adhesion layer 136 at the bottom of the via 128 may be removed by an etch process prior to a Cu filling process, such that the Cu metal (not shown) is in direct contact with the conductive interconnect structure 122. According to another embodiment of the invention, following the removal of the portion 140 and the cobalt nitride adhesion layer 136 from the bottom of the via 128, a Ru seed layer (not shown) may be deposited in the interconnect opening 124 prior to a Cu filling process. According to yet another embodiment, the Ru seed layer (not shown) may be removed from the bottom of the via 128 by an etch process prior to filling the interconnect opening 124 with Cu metal, such that the Cu metal (not shown) is in direct contact with the conductive interconnect structure 122.

Figure 5A:
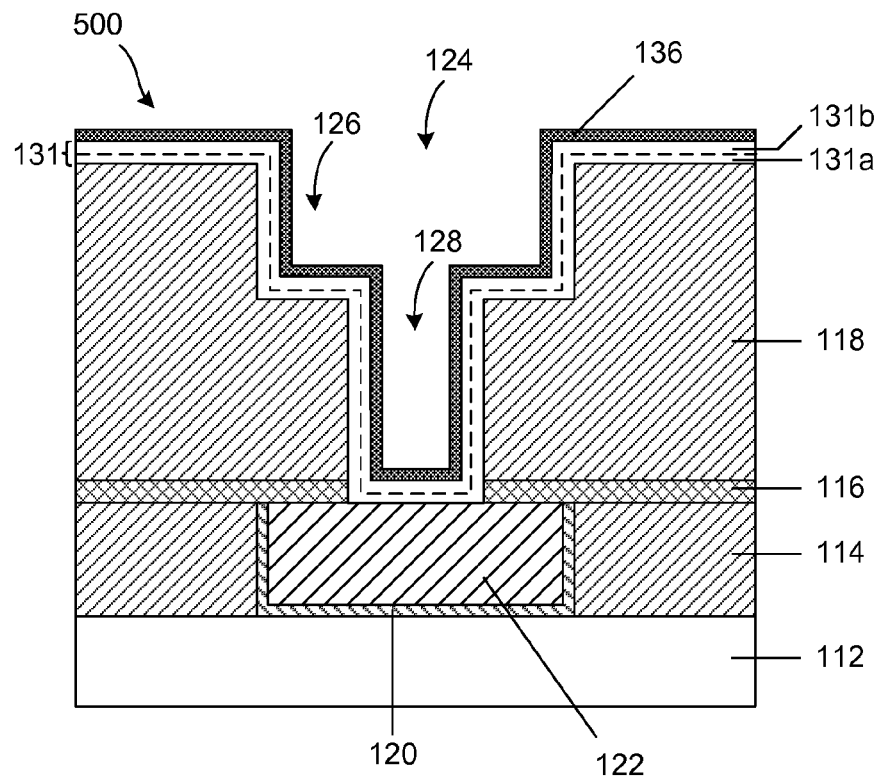
FIGS. 5A-5B schematically show cross-sectional views for forming an interconnect structure containing a dual damascene opening according to an embodiment of the invention.
Figure 5B:
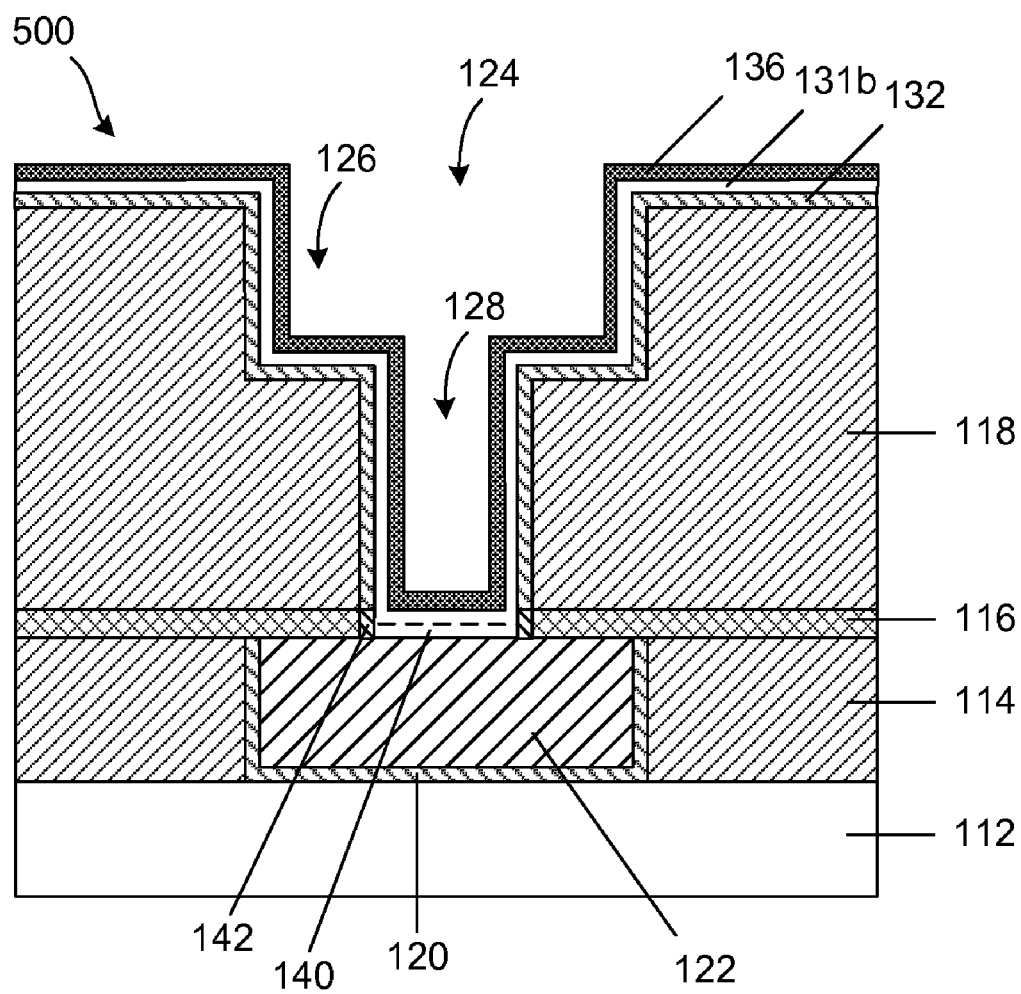

FIGS. 5A-5B schematically show cross-sectional views for forming an interconnect structure containing a dual damascene opening according to embodiments of the invention. Referring back to FIG. 3A, a cross-sectional view of an interconnect structure 300 containing a cobalt metal layer 131 deposited in the interconnect opening 124 is schematically shown. The cobalt metal layer 131 contains a first portion 131a in contact with the dielectric material 118 and a second portion 131b on the first portion 131a.

In FIG. 5A, a cobalt nitride adhesion layer 136 deposited on the second portion 131b of the cobalt metal layer 131 by exposing the interconnect structure 500 to a deposition gas.

In FIG. 5B, the first portion 131a is thermally reacted with at least a portion of the dielectric material where diffusion barrier 132 is formed from reaction of cobalt metal from the first portion 131a with a dielectric reactant element from the dielectric material 118. The resulting interconnect structure 500 shown in FIG. 5B contains diffusion barrier 132, second portion 131b of the cobalt metal layer 131 on the diffusion barrier 132, and cobalt nitride adhesion layer 136 on the second portion 131b. Furthermore, FIG. 5B depicts a portion 142 of the first portion 131a on the etch stop layer 116. The portion 142 may contain unreacted cobalt metal if the cobalt metal does not react with the etch stop layer 116, or the portion 142 may contain a compound formed from a reaction between the first portion 131a and the etch stop layer 116. FIG. 5B further shows a portion 140 of the first portion 131a at the bottom of the via 128 in contact with the conductive interconnect structure 122. The portion 140 may consist of cobalt metal or the portion 140 may contain a mixture formed by diffusion between the first portion 131a and the conductive interconnect structure 122. For example, the portion 140 may contain a cobalt copper mixture or a cobalt tungsten mixture.

According to embodiments of the invention, the interconnect structure 500 shown in FIG. 5B may be further processed as described above in reference to FIGS. 1E-1F.

According to another embodiment, the interconnect structure 500 schematically shown in FIG. 5B may further include a Ru seed layer (not shown) deposited on the cobalt nitride adhesion layer 136 prior to a Cu filling process.

Still referring to the interconnect structure 500 in FIG. 5B, according to yet another embodiment, the second portion 131b of the cobalt metal layer 131 at the bottom of the via 128 and the portion 140 may be removed by a sputter etch process or by a chemical etch process prior to depositing the cobalt nitride adhesion layer 136, and filling the interconnect opening 124 with Cu metal (not shown). According to another embodiment of the invention, following the removal of the second portion 131b of the cobalt metal layer 131 from the bottom of the via 128, following removal of the portion 140, and subsequent deposition of the cobalt nitride adhesion layer 136, a Ru seed layer (not shown) may be deposited onto the cobalt nitride adhesion layer 136 prior to a Cu filling process.

Still referring to the interconnect structure 500 in FIG. 5B, according to yet another embodiment of the invention, the second portion 131b, the portion 140, and the cobalt nitride adhesion layer 136 at the bottom of the via 128 may be removed by an etch process prior to a Cu filling process, such that the Cu metal (not shown) is in direct contact with the conductive interconnect structure 122. According to another embodiment of the invention, following the removal of the second portion 131b, the portion 140, and the and cobalt nitride adhesion layer 136 from the bottom of the via 128, a Ru seed layer (not shown) may be deposited in the interconnect opening prior to a Cu filling process. According to yet another embodiment, the Ru seed layer (not shown) may be removed from the bottom of the via 128 by an etch process prior to filling the interconnect opening 124 with Cu metal, such that the Cu metal (not shown) is in direct contact with the conductive interconnect structure 122.

Although not shown in FIGS. 1-5, removal of one or more layers (e.g., portion 140, cobalt nitride adhesion layer 136, and Ru seed layer 138) from the bottom of bottom of the via 128 by an etch process may further result in at least partial removal of the one or more layers from other areas of the interconnect structures.

According to other embodiments of the invention, a thermal anneal may be performed following filling of the interconnect opening with Cu metal. According to one embodiment of the invention, a method for fabricating an interconnect structure includes depositing a cobalt metal layer in an interconnect opening formed within a dielectric material, where the dielectric material comprises a dielectric reactant element, forming a cobalt nitride adhesion layer in the interconnect opening, and filling the interconnect opening with Cu metal, wherein the cobalt metal layer and the cobalt nitride adhesion layer surround the Cu metal within the interconnect opening. The method further includes, following the filling, thermally reacting at least a portion of the cobalt metal layer with at least a portion of the dielectric material to form a diffusion barrier comprising a compound of cobalt from the cobalt metal layer and the dielectric reactant element from the dielectric material.

Figure 6A:
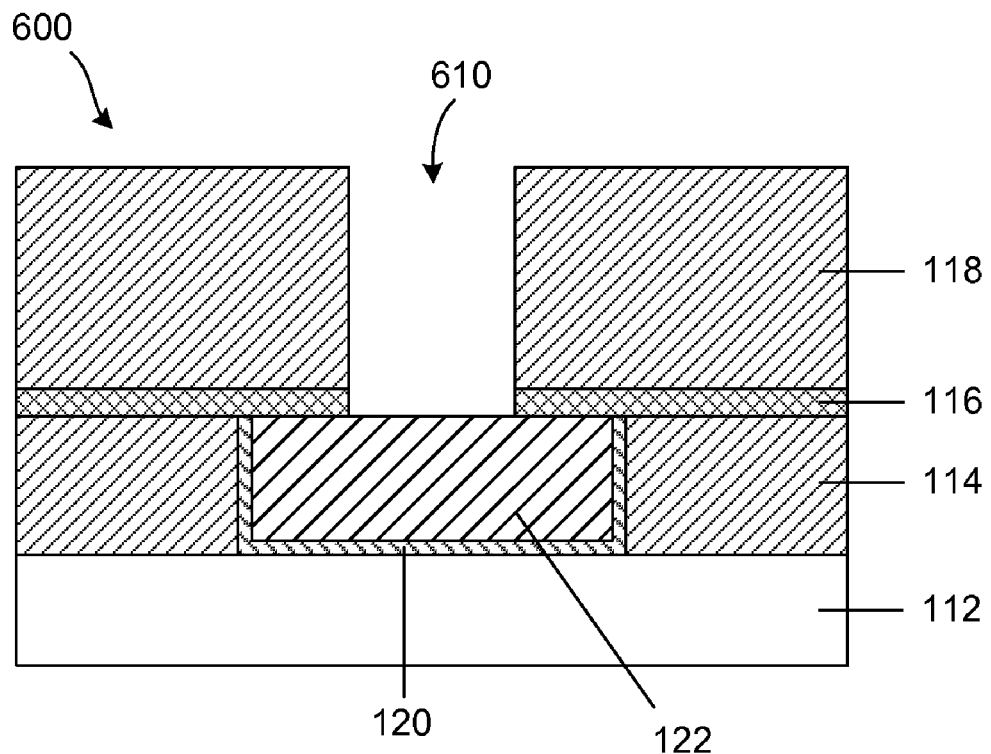
FIGS. 6A-6B schematically show cross-sectional views of additional interconnect structures according to embodiments of the invention.
Figure 6B:
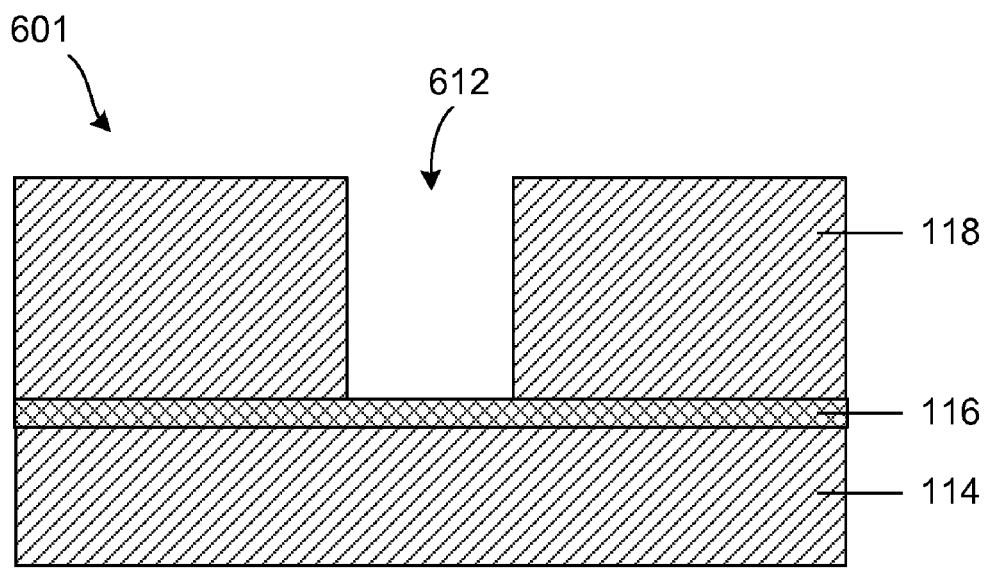

A dual damascene opening is illustrated in the exemplary embodiments of FIGS. 1-5, but embodiments of the invention may be applied to other types of openings found in integrated circuit design. In one example, FIG. 6A schematically shows a cross-sectional view of a via interconnect structure according to one embodiment of the invention. The interconnect structure 600 is similar to the interconnect structure 100 depicted in FIG. 1A but contains a via 610 within the dielectric material 118 over conductive interconnect structure 122. In another example, FIG. 6B schematically shows a cross-sectional view of a trench interconnect structure according to one embodiment of the invention. The trench interconnect structure 601 contains a trench 612 within the dielectric material 118. As will be appreciated by those skilled in the art, embodiments of the invention can be readily applied to the interconnect structures depicted in FIGS. 6A-6B. For example, a cobalt metal layer 130 may be deposited over the via 610 or trench 612 and then thermally annealed to react the reactive metal with a dielectric reactant from the dielectric material 118 to form a diffusion barrier 132, either before or after forming a cobalt nitride adhesion film in the via 610 or trench 612, and filling the via 610 or trench 612 with Cu metal 134.

A plurality of embodiments for manufacturing an interconnect structure for integrated circuits has been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An interconnect structure, comprising:
   an interconnect opening formed within a dielectric material;
   a diffusion barrier in direct contact with the dielectric material, the diffusion barrier comprising a compound from a thermal reaction between cobalt (Co) metal from at least a portion of a cobalt metal layer formed on the dielectric material and a dielectric reactant element from the dielectric material, wherein the compound includes cobalt silicide, cobalt silicate, cobalt silicon oxynitride, cobalt oxide, cobalt nitride, or cobalt carbide, or a combination thereof;
   a cobalt nitride adhesion layer in the interconnect opening; and
   a copper (Cu) metal fill in the interconnect opening, wherein the diffusion barrier and the cobalt nitride adhesion layer surround the Cu metal fill within the interconnect opening.

2. The interconnect structure of claim 1, wherein the dielectric reactant element is Si, O, N, C, or halogen, or a combination thereof.

3. The interconnect structure of claim 2, wherein the dielectric material comprises $SiO_2$, SiON, SiN, or a low-k material.

4. The interconnect structure of claim 1, wherein the dielectric material comprises a SiCOH material and the dielectric reactant element comprises Si, O, or C, or a combination thereof.

5. The interconnect structure of claim 1, further comprising a portion of the cobalt metal layer between the diffusion barrier and the cobalt nitride adhesion layer.

6. The interconnect structure of claim 1, further comprising:
   a Ru seed layer located between the cobalt nitride adhesion layer and the Cu metal fill.

7. The interconnect structure of claim 1, wherein the interconnect opening comprises a trench, a via, or a dual damascene opening.

8. The interconnect structure of claim 1, wherein the interconnect opening comprises a conductive interconnect structure at the bottom of the interconnect opening.

9. The interconnect structure of claim 8, wherein the conductive interconnect structure is in direct contact with the Cu metal fill.

10. The interconnect structure of claim 8, further comprising a portion of the cobalt metal layer located between and in direct contact with the conductive interconnect structure and the cobalt nitride adhesion layer.

11. The interconnect structure of claim 8, wherein the cobalt nitride adhesion layer is located between and in direct contact with the conductive interconnect structure and the Cu metal fill.

12. The interconnect structure of claim 8, wherein the cobalt nitride adhesion layer is located between and in direct contact with the conductive interconnect structure and a Ru seed layer, and wherein the Ru seed layer is located between the cobalt nitride adhesion layer and the Cu metal fill.

13. The interconnect structure of claim 8, further comprising a Ru seed layer located between and in direct contact with the conductive interconnect structure and the Cu metal fill.

* * * * *